(12) United States Patent
Bowden et al.

(10) Patent No.: US 7,898,531 B2
(45) Date of Patent: Mar. 1, 2011

(54) SYSTEM AND METHOD OF OPERATING AN OUTPUT DEVICE IN A VEHICLE

(75) Inventors: Upton B. Bowden, Canton, MI (US);
David M. Chi, Canton, MI (US);
Theodore C. Wingrove, Canton, MI (US); Michael A. Haen, Ann Arbor, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 1098 days.

(21) Appl. No.: 11/646,104

(22) Filed: Dec. 27, 2006

(65) Prior Publication Data
US 2008/0157605 A1 Jul. 3, 2008

(51) Int. Cl.
*G06F 3/041* (2006.01)
(52) U.S. Cl. ...................... 345/173; 345/156
(58) Field of Classification Search ............. 345/156, 345/204, 87, 173–176, 168–170
See application file for complete search history.

(56) References Cited

U.S. PATENT DOCUMENTS

| | | | |
|---|---|---|---|
| 4,562,315 A | 12/1985 | Aufderheide | |
| 5,512,718 A | 4/1996 | Larose | |
| 5,594,222 A | 1/1997 | Caldwell | |
| 5,983,146 A | 11/1999 | Sarbach | |
| 6,061,446 A | 5/2000 | Lester et al. | |
| 6,310,611 B1 | 10/2001 | Caldwell | |
| 6,320,282 B1 | 11/2001 | Caldwell | |
| 6,621,029 B2 | 9/2003 | Galmiche et al. | |
| 6,664,489 B2 | 12/2003 | Kleinhans et al. | |
| 6,798,395 B1 | 9/2004 | Yamauchi et al. | |
| 6,819,990 B2 | 11/2004 | Ichinose | |
| 6,897,390 B2 | 5/2005 | Caldwell et al. | |
| 7,023,215 B2 | 4/2006 | Steenwyk | |
| 7,030,860 B1 | 4/2006 | Hsu et al. | |
| 7,098,414 B2 | 8/2006 | Caldwell | |
| 7,136,051 B2 | 11/2006 | Hein et al. | |
| 7,138,984 B1 | 11/2006 | Miles | |
| 7,142,189 B2 | 11/2006 | Engelmann | |
| 7,180,017 B2 * | 2/2007 | Hein ........................ 200/5 R |
| 7,350,949 B2 * | 4/2008 | Meinke et al. ............. 362/540 |
| 2002/0057020 A1 | 5/2002 | Caldwell | |
| 2003/0122794 A1 | 7/2003 | Caldwell | |
| 2003/0159910 A1 | 8/2003 | Caldwell | |
| 2003/0169226 A1 | 9/2003 | Yamada | |

(Continued)

FOREIGN PATENT DOCUMENTS

EP 1 420 333 B1 5/2004

*Primary Examiner*—Ricardo L Osorio
(74) *Attorney, Agent, or Firm*—Brinks Hofer Gilson & Lione

(57) ABSTRACT

A system for operating an output device in a vehicle. The system includes a trim component and operative and initial sensors positioned at the back side of the trim component. An operative sensor provides a signal to at least one output device when an object is detected within a second sensing region adjacent the front side of the trim component. An initial sensor provides a signal to a display device for selectively displaying the location of the second sensing region, when an object is sensed within a first sensing region adjacent the front side of the trim component. Additional aspects of the invention include various systems and methods for operating the output device in a vehicle.

20 Claims, 6 Drawing Sheets

U.S. PATENT DOCUMENTS

| | | |
|---|---|---|
| 2003/0193013 A1 | 10/2003 | Balp et al. |
| 2004/0075360 A1 | 4/2004 | Stadelmann |
| 2005/0035951 A1 | 2/2005 | Bjorkengren |
| 2005/0116818 A1* | 6/2005 | Kennedy et al. ............ 340/500 |
| 2005/0134485 A1 | 6/2005 | Hein et al. |
| 2006/0038793 A1 | 2/2006 | Philipp |
| 2006/0061125 A1 | 3/2006 | Schmidt et al. |
| 2006/0114197 A1 | 6/2006 | Sibbett |
| 2006/0134381 A1 | 6/2006 | Homburg et al. |
| 2006/0262549 A1* | 11/2006 | Schmidt et al. ............. 362/459 |

* cited by examiner

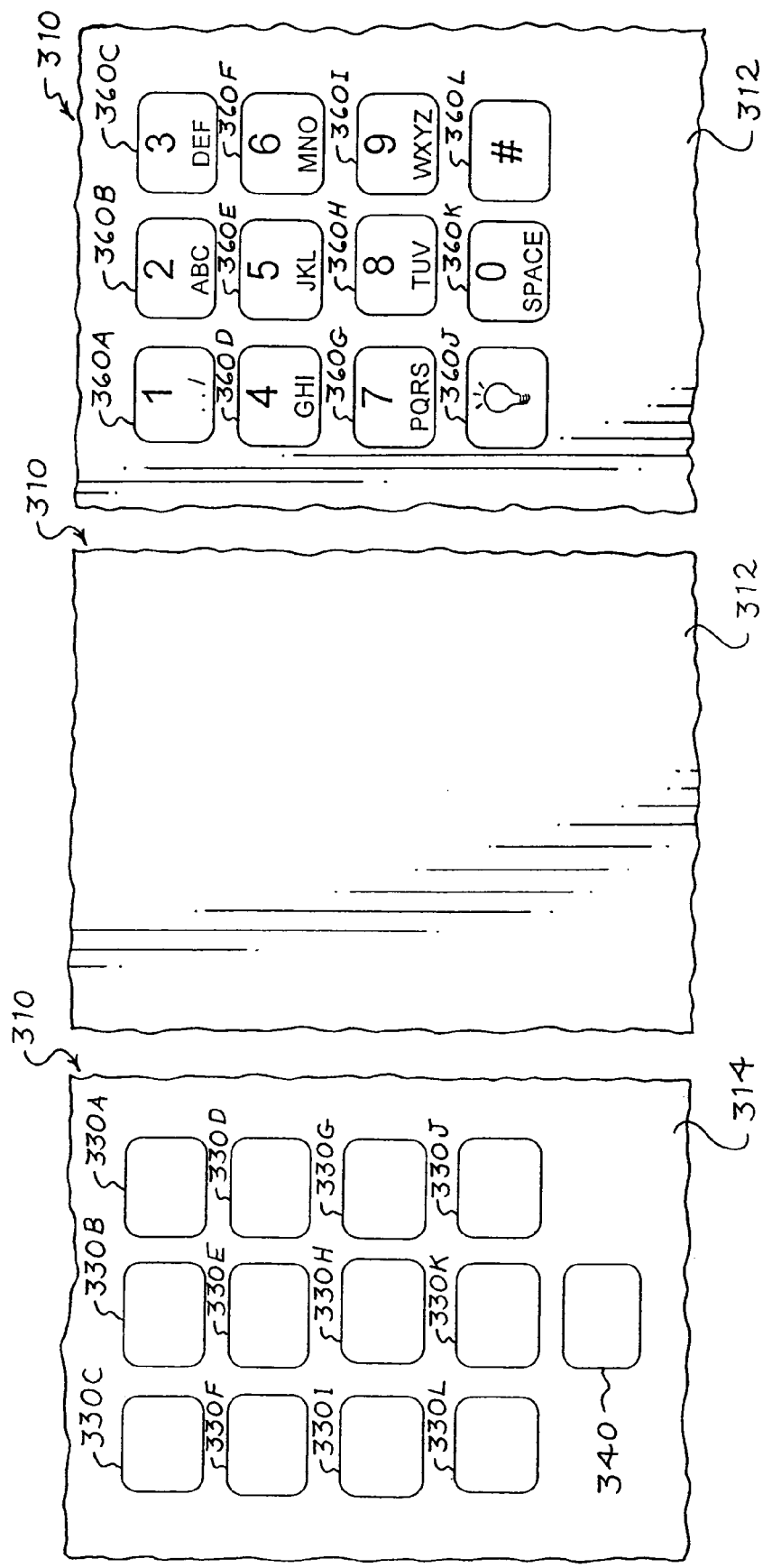

SYSTEM AND METHOD OF OPERATING AN OUTPUT DEVICE IN A VEHICLE

TECHNICAL FIELD

The present invention relates generally to systems and methods for operating one or more output devices in a vehicle. In particular, the present invention relates to a vehicle trim component having a control panel.

BACKGROUND

Motor vehicles, for example automobiles, have a variety of output devices that are configured to be manually controlled. Examples of typical devices include, but are not limited to, interior and exterior lights, the climate control system, windows and mirrors, audio/video equipment, and communications equipment, such as telephones and internet devices.

To operate these output devices, the automotive interior typically includes a large number of visible controls, such as dials and switches that are permanently displayed throughout the interior. These controls are generally accompanied by visible indicia, such as icons, emblems, logos, or other indicators that provide information to the occupant, such as the location, function, and status of the control. If an optional output device is omitted from the vehicle, one or more dummy panels are typically provided and displayed in place of the control. Although much effort is made to incorporate such visible controls, panels, and other indicia into the interior design, these features often disrupt rather than complement the styling of the interior. Given the increasing number of manually operated output devices in vehicles, vehicle interiors are becoming increasingly more cluttered. Consequently, user control systems are becoming more complex and less intuitive, which negatively impacts user satisfaction.

Visible controls, such as electromechanical switches, have a variety of issues. For example, because switching requires physical movement, such switches are prone to mechanical wear, and thus, they may have a limited useful life. Visible controls typically include a variety of openings, gaps, and seams, for example between the switch mechanism and faceplate, or between the faceplate and the adjacent trim component, that can attract dust and dirt and that are difficult to clean. Further, such gaps and seams are aesthetically unpleasing and provide a conduit for moisture and dust to enter and foul the electrical components of the switch.

In view of the foregoing, there exists a need in the art for systems and methods for operating output devices that do not rely on visible controls.

BRIEF SUMMARY OF THE INVENTION

According to an aspect of the invention, a system is provided for operating an output device in a vehicle and comprises a trim component having a front side and a back side, an operative sensor, and an initial sensor. The operative sensor may be positioned at the back side of the trim component for providing a signal to at least one output device when an object is detected within a second sensing region adjacent the front side of the trim component. The initial sensor may be positioned at the back side of the trim component for providing a signal to a display device to selectively display the location of the second sensing region when an object is detected within a first sensing region adjacent the front side of the trim component. The initial and operative sensors may include any sensor that is suitable for the application including, but not limited to, capacitive sensors and Hall-effect sensors.

When the system is not being used, the location of the second sensing region is preferably not visible on the front side of the trim component. Conversely, when the system is being used, the location of the second sensing region may be selectively displayed on the trim component by virtue of the display device. The system may comprise a timer for deactivating the display device after a predetermined amount of time, for example, after a predetermined amount of time from a prior detection by the operative sensor.

The system may comprise at least one additional sensor positioned at the back side of the trim component for providing a signal when an object is detected within a respective sensing region adjacent the front side of the trim component. At least one of the additional sensors may be an operative sensor for providing a signal to at least one output device, and/or at least one may be an initial sensor for providing a signal to the display device.

According to another aspect of the invention, a system for operating an output device may be provided and comprise a display device for selectively displaying one or more indicia on the front side of the trim component. The display device may include a lighting element for projecting one or more indicia on the front side of the trim component.

The trim component may be translucent and is preferably at least partly opaque. The component may include a front layer having a front surface and a back layer having a back surface where the front surface layer is more translucent than the back surface layer. The back surface layer may comprise an aperture for providing an optical pathway between the back surface and the front surface. The aperture may be formed in a suitable shape and a backlight may be provided to project the shape from the back side of the trim component to the front side of the trim component.

According to another aspect of the invention, the initial sensor may be configured to detect an object within a first maximum distance from the trim component and the operative sensor may be configured to detect an object within a second maximum distance from the trim component. The second maximum distance is preferably less than the first maximum distance so that the initial sensor will detect an object (for example a hand) as it approaches the trim component before the operative sensor can detect the object.

According to yet another aspect of the invention, a method of operating an output device in a vehicle is described. The method comprises the steps of providing a trim component having a front side and a back side, sensing an object within a first sensing region adjacent the front side of the trim component, providing a signal to a display device for selectively displaying the location of a second sensing region adjacent the front side of the trim component, and sensing an object within the second region. The method may further include the step of providing a signal to at least one output device (for example, for performing a first function) when an object is detected within the second sensing region. The display device may preferably be deactivated after a predetermined amount of time.

Other method steps may include sensing an object within the first sensing region at a first distance from the trim component and sensing the object within the second sensing region at a second distance from the trim component, where the second distance is less than the first distance.

Still other method steps may include sensing an object within a third sensing region adjacent the front side of the trim component. A signal may be provided to a display device for selectively displaying the location of a fourth sensing region adjacent the front side of the trim component. Alternatively, a signal may be provided to the at least one output device for performing a second function when an object is detected within the second sensing region.

BRIEF DESCRIPTION OF THE DRAWINGS

FIG. 5A is a schematic of the back side of a trim component and a control system according to an aspect of the invention;

FIG. 5B shows a front view of the trim component of FIG. 5A where the controls are not visible;

FIG. 5C shows a front view of the trim component of FIG. 5A where the controls are visible;

DETAILED DESCRIPTION OF THE INVENTION

The present invention relates generally to systems and methods for operating output devices in a vehicle. Indications are given throughout the specification to preferred and alternative embodiments of the invention, including the application of various aspects of the invention to automotive interior trim components. It should, however, be understood that the following detailed description is illustrative, rather than limiting, and that the invention is not limited to automotive or interior applications.

Figure 1A:
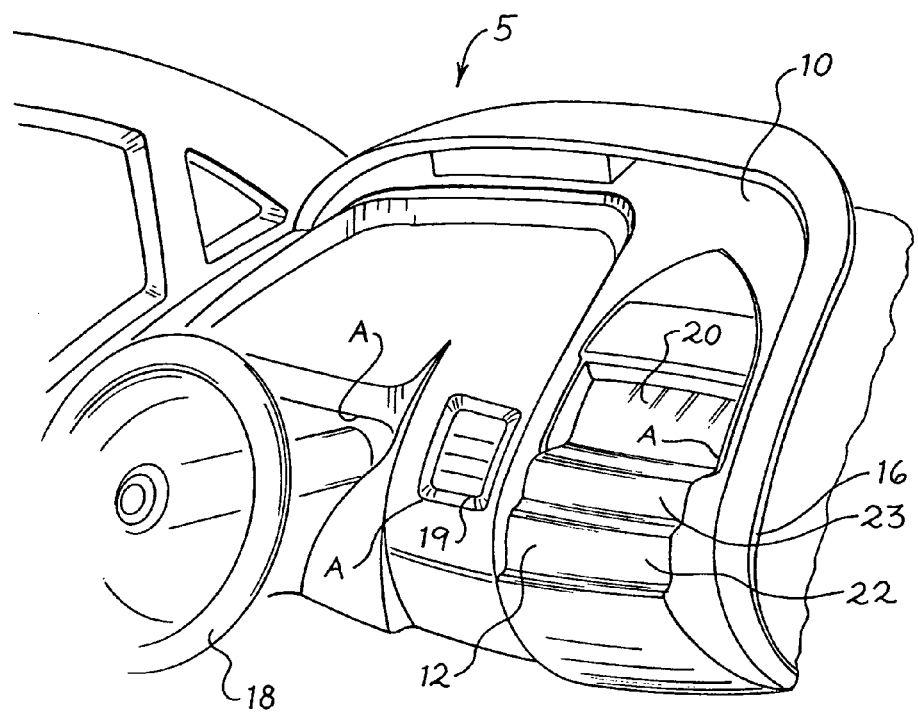
FIG. 1A is a partial perspective view of an automotive vehicle interior including an instrument panel.

FIG. 1A is a perspective view of a vehicle interior that shows a driver-side view of an automotive cockpit 5 from the perspective of a passenger. The cockpit comprises a variety of trim components, including, but not limited to, an instrument panel, door panels, consoles, headliners, mirrors, window pillars, steering wheel and cover, and seating surfaces. Each of these components may comprise one or more control panels for manually operating an output device in the vehicle.

Figure 1B:
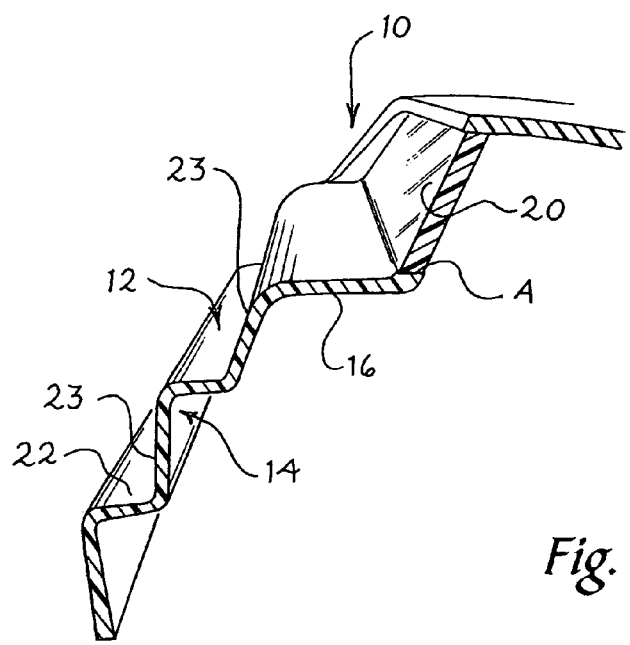
FIG. 1B is a partial cross-sectional view of the instrument panel of FIG. 1A, taken through the center stack area.

The cockpit 5 includes an instrument panel 10 having a front side with a front surface 12 and a back side with a back surface 14 (shown in FIG. 1B). The front surface 12 is generally exposed in the interior of the vehicle and may include various decorations, such as contours, patterns, grains, colors, and tactile surfaces consistent with the styling of the interior. The back surface 14 is generally hidden and may include structural supports and features for affixing the instrument panel to the vehicle. The front and back surfaces 12, 14 define a substrate 16 that may include various openings or apertures A for including additional interior components, such as the steering wheel 18, air vents 19, and electronic displays 20.

Typically, a trim component, such as an instrument panel, will include one or more control panel components that are separately manufactured and subsequently affixed to the component within a preconfigured aperture A. Such a control panel may include not only electrical components (e.g. mechanical controls and associated electronics), but also a decorative faceplate that is configured to hide the electronics and to complement or match the styling of the instrument panel. More often, the faceplate detracts from the styling of the instrument panel and provides gaps and other openings between the control panel and trim component that are aesthetically unpleasing and that collect dust and moisture.

In the embodiment shown in FIGS. 1A and 1B, the center stack area of the instrument panel 10, the area between the driver and front passenger sides of the cockpit 5, includes a control panel area 22. The control panel area 22 may be contoured and include a terraced structure with multiple control surfaces 23, as shown. In contrast with prior art control panels, the control panel area 22 does not include visible controls, faceplates, or other such indicia that can detract from the styling of the instrument panel. Instead, the trim panel includes a control panel area 22 with hidden controls. The location of the controls may be visible when a user is operating the controls and may be generally not visible when the user is not operating the controls. In FIG. 1A, the location of the controls is not visible.

Figure 2:
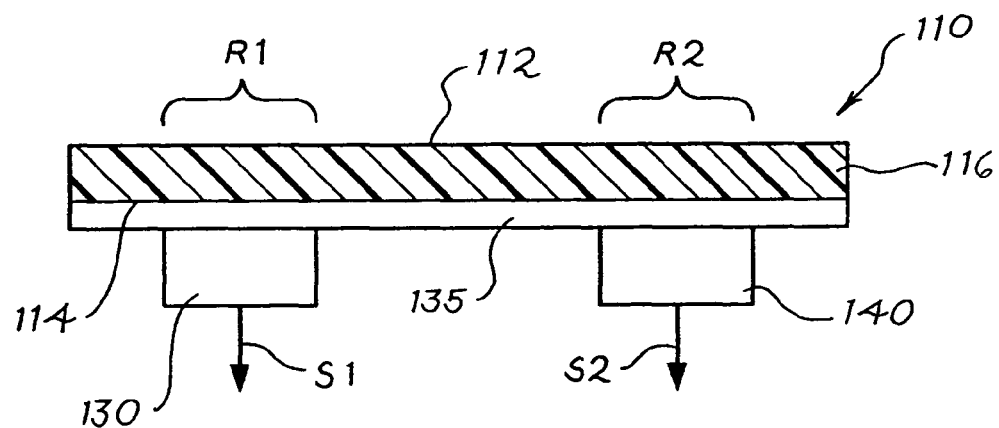
FIGS. 2 and 3 are cross-sectional views of control systems, according to several aspects of the invention.

FIG. 2 generically shows a control panel according to an aspect of the invention. A trim component 110 is shown and includes a front side having a front surface 112 and a back side having a back surface 114. The front and back surfaces 112, 114 define a substrate 116. A first sensor 130 and a second sensor 140 are positioned at the back side of the substrate 116 adjacent the back surface 114. Sensors 130, 140 may be disposed on a flexible or a rigid circuit board 135, which is shown positioned between the sensors 130, 140 and the back surface 114 of the substrate 116. The board 135 is preferably clear or translucent for reasons that will become apparent. In the embodiment shown in FIG. 2, the front surface 112 of the trim component 110 does not include any visible controls or other indicia that would indicate the presence or location of the sensors or sensing regions.

Sensors 130, 140 may be operative sensors that are configured to operate one or more output devices, such as a mirror positioner, a light fixture, a telephone or other device. Each of the sensors 130, 140 has a field with a sensing region R1, R2 and is positioned and configured to provide a signal S1, S2 when an object, such as a hand, is sensed within the respective sensing region R1, R2 on the front side of the trim component. The sensors 130, 140 may be tuned so that their respective fields extend through the substrate 116 to the front surface 112 of the trim component. Accordingly, in order to trigger a sensor, the triggering object would have to touch or make physical contact with the substrate 116. The sensors 130, 140 may alternatively be tuned so that their fields extend a predetermined distance beyond the front surface 112 of the trim component. In such a construction, the sensors 130, 140 will be able to detect the triggering object, e.g. a hand, without the object contacting the trim component.

Various sensors are contemplated and are within the scope of the present invention. Examples of suitable sensors include, but are not limited to, proximity sensors such as capacitive, infrared, electric field, acoustic, and electromagnetic touch sensors. In addition, Hall-effect sensors, such as the TouchCell™ Field-Effect sensor manufactured by Touch-Sensor Technologies, LLC of Wheaton, Ill. may be used and are preferable, for example, in applications where capacitive signals from other applications would interfere or make it difficult to tune a capacitive field.

A display device (not shown) may be provided for selectively displaying the location of one or both of the sensing regions R1, R2 on the front side of the trim component 110. In vehicle applications, the display device may be activated, for example, when the vehicle is turned on (e.g. when a key is placed in the ignition in an automobile) and deactivated, for example, when the vehicle is turned off. According to an aspect of the invention, sensor 140 may be an initial sensor that is configured to activate the display device to selectively display the location of sensing region R1. Signals S1, S2 may be directly transmitted to a respective output or display device, or a processor (not shown) may be provided for receiving and processing incoming signals S1, S2 and for transmitting signals to the desired output and/or display devices.

In some embodiments of the invention, the front surface 112 may comprise visual or tactile features, such as bumps, depressions, or other surface details that correspond with or indicate the presence or location of one or both of the sensors 130, 140 or of sensing regions R1, R2. In these embodiments, a display device (not shown) may optionally be provided and may be helpful in applications in which the visual or tactile features are not always visible (e.g. when the front surface of the trim component is inadequately illuminated). An example of a suitable display device is a lighting device (not shown) that is configured to selectively illuminate and display the front surface of the trim component. The lighting device may comprise any suitable light source, for example a light emitting diode ("LED"), a halogen bulb, an incandescent bulb, or the like.

Visual or tactile features may be applied to the trim component, for example, by affixing a decal or by painting or coating the front surface, or may be provided directly in the substrate of the trim component, for example by injection molding or vacuum thermoforming. In a preferred embodiment, a trim component may include a decorative coverskin with one or more details applied in the skin, as disclosed in U.S. Published Patent Application Serial No. 2006/0134381A1, which is herein incorporated by reference.

Figure 3:
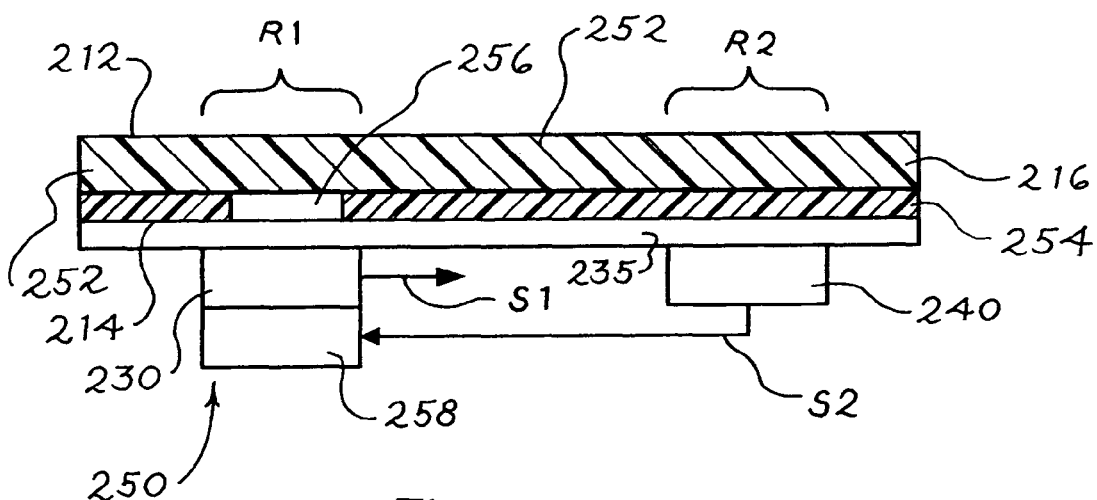

Turning to FIG. 3, another trim component substrate 216 is shown and includes a front side with a front surface 212, a back side with a back surface 214, and operative and initial sensors 230, 240 positioned at the back side of the substrate adjacent the back surface 214. A circuit board 235 is provided and is sandwiched between the sensors 230, 240, and the back surface 214. The operative sensor 230 has a sensing region R1 and is configured to provide a signal S1 to an output device (not shown) when an object is detected within region R1 adjacent the front side of the trim component. The initial sensor 240 has a second sensing region R2 and is configured to provide a signal S2 to a display device 250 when an object is detected within region R2.

The substrate 216 shown in FIG. 3 comprises a front layer 252 that includes the front surface 212, and a back layer 254 that includes the back surface 214. The front layer 252 may be configured to allow transmission of light therethrough and may comprise any suitable transparent, translucent, or partially opaque material including, but not limited to, thermoplastic polyolefin ("TPO"), polyvinyl chloride ("PVC"), polyurethane, polycarbonate, and acrylic materials. The front layer 252 may include one or more rigid, semi-rigid, and/or flexible layers, such as coverskins foams, paints or coatings, films, and laminates. The front layer preferably has a thickness of approximately 2.0 to 4.0 mm, more preferably approximately 2.5 mm. The front layer 252, however, may be thinner than 2.0 mm or thicker than 4.0 mm according to the particular application.

The back layer 254 comprises a translucent or opaque material that is capable of limiting light transmission therethrough. Although the back layer 254 is preferably completely opaque, in the embodiment shown in FIG. 3, it need only block more light than the front layer 252. The back layer may comprise any suitable material or structure, such as those described above with respect to the front layer. The back layer may have a thickness of approximately 0.010 to 0.040 inches. The thickness may be greater or less depending on various factors including, but not limited to, the type of material, the manufacturing process, and the thickness that is required to achieve the desired opacity.

In one preferred embodiment, the front layer comprises a rigid translucent polycarbonate or TPO material and the back layer comprises a relatively opaque paint or coating, or an opaque film that is joined, for example, by lamination or co-extrusion. In another preferred embodiment, the front layer comprises a translucent flexible coverskin and/or foam material and the back layer comprises a relatively opaque rigid plastic, such as a polycarbonate or TPO.

Figure 4A:
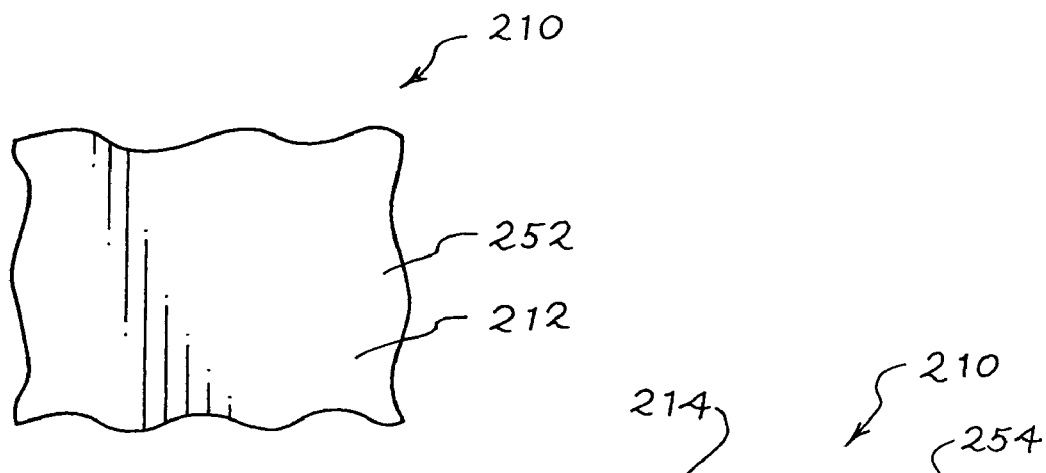
FIG. 4A is a partial front view of a trim component with selectively visible controls, where the controls are not visible.

In FIG. 3, the back layer 254 of the substrate 216 has a void or aperture 256 that provides an optical pathway between the back surface 214 and the front surface 212. The aperture 256 is preferably configured in a shape, such as an icon, logo, or other indication that is sufficient to communicate the position, function, and/or status of the sensor 230, as shown in FIG. 4B.

The aperture 256 may be provided by various methods. For example, if the back layer 254 is applied by a coating process, a removable mask or decal in the shape of the aperture may be applied to the back surface of the front layer 252 prior to and removed subsequent to the application of the back layer. Alternatively, if the front and back layers 252, 254 are manufactured using a co-extrusion/injection molding process, the aperture 256 may be applied directly in the mold.

In the embodiment shown in FIG. 3, the display device 250 includes a lighting element 258, having a light source such as a LED, light emitting polymer, a light pipe, incandescent bulb, or the like. The lighting element 258 emits light at the back surface 214 of the substrate 216 behind the aperture 256. When the lighting element 258 is activated, light is transmitted through the front layer 252. Because the back layer 254 is more opaque than the front layer 252, the light will be displayed on the front surface 212 in the shape of the aperture 256. In alternative embodiments, the lighting element 258 may include a light pipe and may be configured so that the light source can be placed to the side or even in front of the sensor.

Figure 4C:
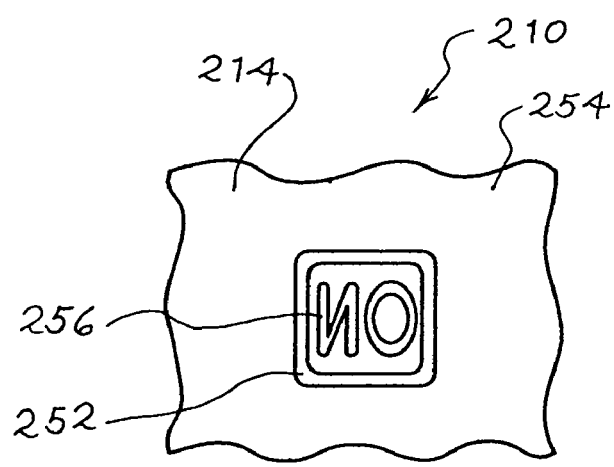
FIG. 4C shows a partial back view of the trim component of FIG. 4A.
Figure 4B:
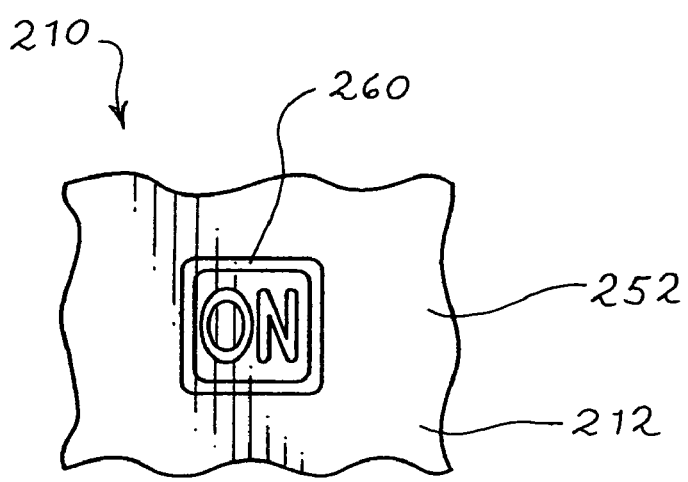
FIG. 4B shows the trim component of FIG. 4A where the controls are visible.

FIG. 4C shows the back side of trim panel 210 with aperture 256 formed in the back layer 254. When the lighting element 258 is activated, the trim component will display indicium 260 corresponding with the shape of the aperture 256, as shown in FIG. 4B. When the lighting element 258 is deactivated, the trim component does not display indicium 260, and the controls are generally invisible, as shown in FIG. 4A. Note that indicium 260 is a mirror image of the aperture 256, when the aperture is viewed from the back.

In vehicle applications, the display device may be activated, for example, when the vehicle is turned on and deactivated, for example, when the vehicle is turned off. The display device 250 is preferably deactivated unless and until the initial sensor 240 is triggered. Accordingly, the trim component will not display indicium 260 and the control panel will be invisible while the vehicle is being operated unless and until the initial sensor 240 is triggered. When an object is detected within the sensing region of the initial sensor 240, the sensor 240 sends a signal S2 to the display device 250, thereby causing indicium 260 to be displayed on the front surface 212 of the trim component 210. Once the display device 250 is activated, it may remain activated until the user deactivates the device 250, for example by triggering the initial sensor 240. Alternatively, a timer (not shown) may be provided to deactivate the display device 250 after a predetermined amount of time has lapsed, for example, after a predetermined amount of time from a prior detection by the operative sensor 230. A processor (not shown) may be provided and positioned between the sensors 230, 240 and the display device 250 and output device (not shown) for receiving and processing signals S1, S2 and for transmitting an appropriate signal to the display and/or output devices.

In a preferred embodiment, the initial sensor 240 is tuned so that its field extends through the substrate 216 a predetermined distance beyond the front surface 212 of the trim component, and the operative sensor 230 is tuned so that its field extends through the substrate 216 up to or slightly beyond the front surface 212. For example, the field of the operative sensor 230 may extend within 1 inch or more beyond the front surface 212 and the field of the initial sensor 240 may extend 2 or more, 4 or more, 6 or more, or 8 or more inches from the surface 212. It should be appreciated that the distances are relative and that the operative and initial sensor fields may extend less than 1 inch and less than 2 inches beyond the front surface, respectively. Accordingly, the display device 250 may be activated from a relatively large distance from the trim component, for example by moving a hand towards the trim component. Once the display device 250 is activated and indicium 260 is displayed, the operative sensor 230 can be triggered at a relatively short distance from the trim component. The distance that each field extends beyond the front surface 212 will be determined based on various considerations, including, but not limited to, the type of sensor used and the particular application. For example, as the size of the field increases, the possibility of a false signal may increase.

FIGS. 5A-5C illustrate another embodiment of the invention, including a trim component 310 with a selectively visible control panel. The trim component 310 includes a substrate with a transparent or translucent front surface 312 (shown in FIGS. 5B and 5C) and a translucent, or an at least partially opaque back surface 314 (shown in FIG. 5A). An array of operative sensors 330A-L is provided and is positioned at the back side of the substrate 316. Each of the sensors 330A-L is aligned with an aperture (not shown) having a shape that corresponds with the function of the respective sensor. Each sensor 330A-L is configured to provide a signal to one or more output devices (not shown) when an object is detected within a respective sensing region adjacent the front side of the trim component 210.

The control panel further comprises an initial sensor 340 that is configured to provide a signal to a display device (not shown), which may include a lighting element as described above, for displaying the location of the operative sensing regions on the front side of the trim component. The lighting element may comprise one or more light sources associated with the operative sensor array 330A-L. For example, each of the sensors 330A-L may be associated with a single light source, such as a single LED, light pipe, or incandescent bulb, or alternatively, each of the sensors 330A-L may be associated with a separate light source. FIG. 5B shows the front surface 312 of the trim panel 310 when the display device (not shown) is deactivated and FIG. 5C shows the front surface when the display device is activated. When the display device is activated, indicia 360A-L are displayed on the front surface 312 of the trim panel 310.

In FIGS. 6A-6D, another trim component 410 is provided that includes a plurality of operative sensors 430A-F positioned at the back side of the trim component adjacent the back surface 414. The sensors 430A-F are configured to provide signals to one or more output devices when an object is detected within a corresponding sensing region R1-6 adjacent the front surface 412. As shown in FIGS. 6A-6D, the operative sensors 430A-F may be used to operate an output device, such as an audio and/or a climate control system.

In the embodiment shown, sensor 430A is a function switch that is used to designate an output device. For example, sensor 430A can be selectively triggered to toggle between a climate control mode (shown in FIGS. 6B and 6C) and an audio mode (shown in FIG. 6D). Sensors 430B-C are level switches that may be used to vary the output level of a device, for example the volume or station for the audio device, or the temperature setting or blower speed for the climate control system. Sensors 430D-F are switches that may be used to select one of a number of configurations for the output devices, for example station presets, or register configuration. A processor (not shown) is preferably provided for receiving and processing sensor signals and for transmitting appropriate signals to the various output devices.

A display device (not shown) is provided for displaying the location of the various operative sensing regions R1-6 on the front side of the trim component 410. For example, the trim component may be backlit as described above. The display device displays indicia 433A-F (shown in FIGS. 6B-6D) for each sensor 430A-F on the front side of the trim panel 410.

Figure 6A:
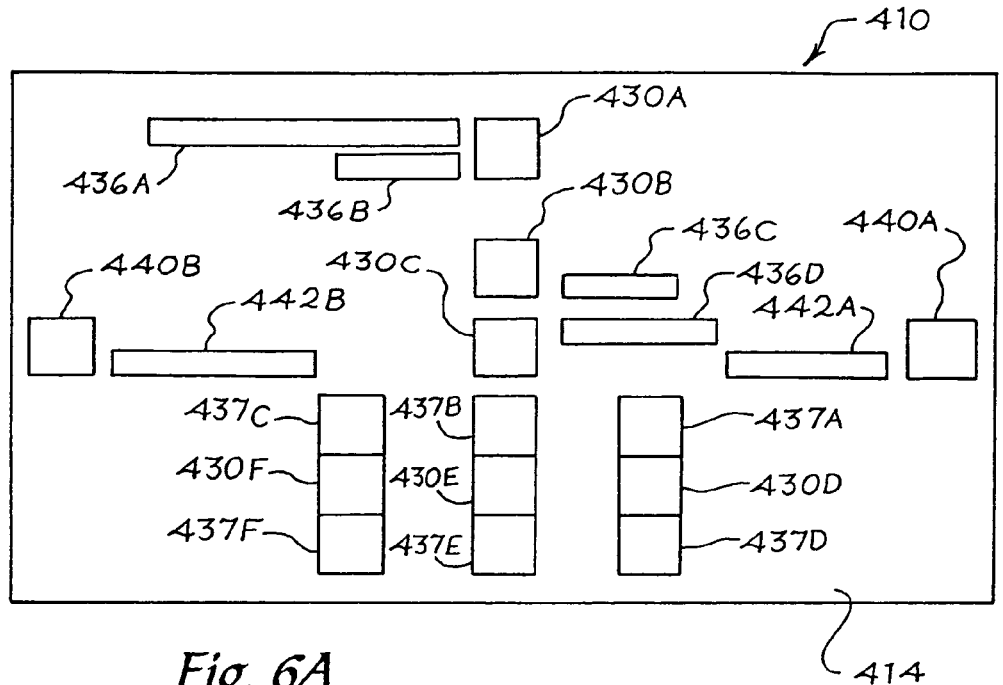
FIG. 6A is a schematic of the back side of a trim component and a control system according to another aspect of the invention.
Figure 6B:
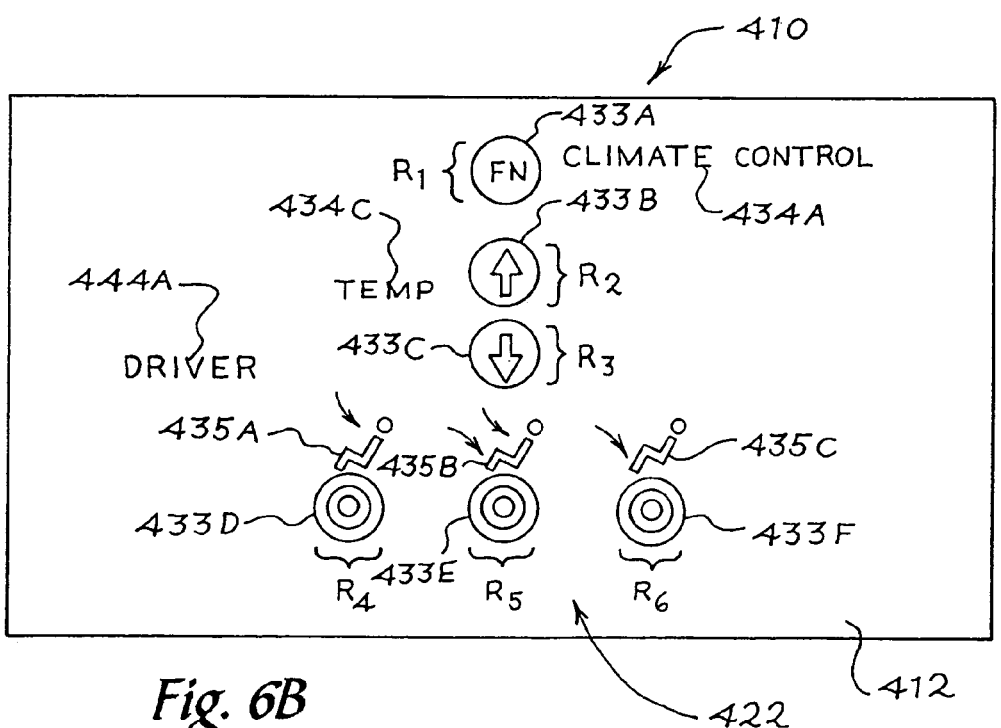
FIGS. 6B-6D show various configurations of the trim component and control system of FIG. 6A.
Figure 6C:
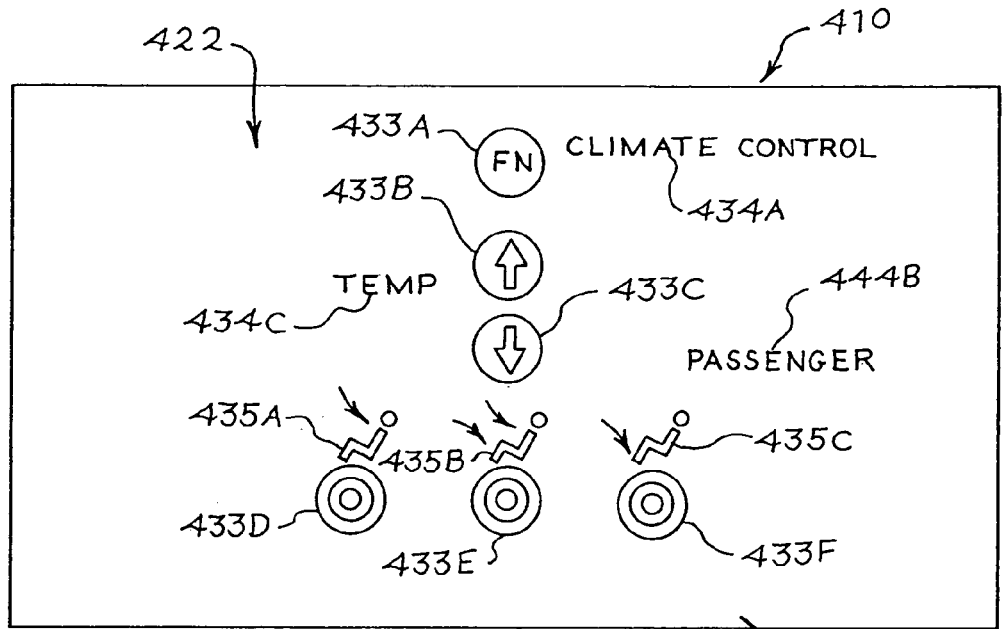

The control panel shown in FIGS. 6A-6D includes various additional selectively visible indicia for transmitting information to the user. For example, when sensor 430A is triggered to select the climate control function, indicia 434A, 434C, and 435A-C are displayed, as shown in FIGS. 6B and 6C. Conversely, when sensor 430A is triggered to select the audio function, indicia 434B, 434D, and 435D-F are displayed. Indicia may be provided and displayed using the backlighting techniques disclosed herein. For example, as shown in FIG. 6A, lighting elements 436A-D and 437A-F may be provided at the back side of the trim component 410 and can be selectively actuated to display indicia 434A-D and 435A-F.

The system shown in FIG. 6A includes two initial sensors 440A, 440B, each having a respective sensing region adjacent the front side of the trim component 410. Each initial sensor 440A, 440B may be configured to provide a signal to a separate display device for displaying separate groups of indicia. This may be particularly advantageous in the tiered instrument panel shown in FIGS. 1A and 1B, where one initial sensor may be provided for displaying indicia on a first tier and another initial sensor may be provided for displaying other indicia on a second tier.

In the embodiment shown in FIGS. 6A-6B, one initial sensor 440A may be positioned in relative proximity to a first user, for example within arm's reach of the driver, and the other initial sensor 440B may be positioned in relative proximity to a second user, for example within arm's reach of a passenger. The sensors 440A, 440B are preferably positioned and tuned so that initial sensor 440A will typically be triggered only by the first user and initial sensor 440B will typically be triggered only by the second user. Accordingly, sensors 440A, 440B may be monitored, and the function of the operative sensors 430A-F and the configuration of the display selected based on the identity of the user.

For example, when initial sensor 440A is triggered, indicium 444A (shown in FIG. 6B) is displayed to indicate that the driver is the user. Conversely, when initial sensor 440B is triggered, indicium 444B (shown in FIGS. 6C-D) is displayed to indicate that the passenger is the user. Indicia 440A, 440B may be provided and displayed via lighting elements 442A, 442B and backlighting techniques disclosed herein.

Alternatively, the function of the operative sensors 430A-F can be selected based on the identity of the user. For example, operative sensors 430D-F may correspond with a first group of presets, such as stored station presets, when the driver is operating the controls in the audio mode and with a second group of presets when the passenger is operating the controls. Similarly, operative sensors 330B-C may be used to control the temperature on the driver's side (for example, in a multi-zone climate control system) when initial sensor 440A is selected and on the passenger's side when initial sensor 440B is selected.

An exemplary method of operating one or more devices in a vehicle will now be described with reference to the embodiment shown in FIGS. 6A-6D. A trim component 410 is provided and comprises a control panel area 422 with selectively visible controls. A plurality of operative sensors 430A-F is provided and is positioned at the back side of the trim component 410 for operating one or more output devices in the vehicle. Each operative sensor 430A-F has a corresponding sensing region on the front side of the trim component. A plurality of initial sensors 440A-B is provided, each of the sensors 440A-B having a sensing region on the front side of the trim component. Each of the initial sensors 440A-B, when triggered, is capable of providing a signal to a display device (not shown) for displaying the location of the sensing regions for the operative sensors 430A-F.

In FIG. 6B, initial sensor 440A has been triggered by the driver which sends a signal to the display device (not shown), causing the location of the operative sensing regions R1-6 to be indicated on the trim panel by visible indicia 433A-F. Additional indicia 434A, 434C, 435A-C, and 444A are displayed on the trim panel and indicate the function of each sensor and that the control panel is in a climate control mode and a driver mode. The driver may selectively trigger operative sensors 430B-C to increase or decrease the temperature of the interior or of the driver's climate control zone, and may selectively trigger operative sensors 430D-F to select a desired register configuration or mode of air delivery. Alternatively, the driver may selectively trigger operative sensor 430A to toggle between the climate control mode and an audio mode.

In FIG. 6C, initial sensor 440B has been triggered by the passenger of the vehicle. Visible indicia 433A-F are still displayed on the front side of the trim component 410. Indicium 444A is no longer displayed and is replaced by indicium 444B, which indicates a passenger mode. The passenger may selectively trigger operative sensors 430A-F, as described above, for example to increase or decrease the temperature of the passenger's climate control zone.

Figure 6D:
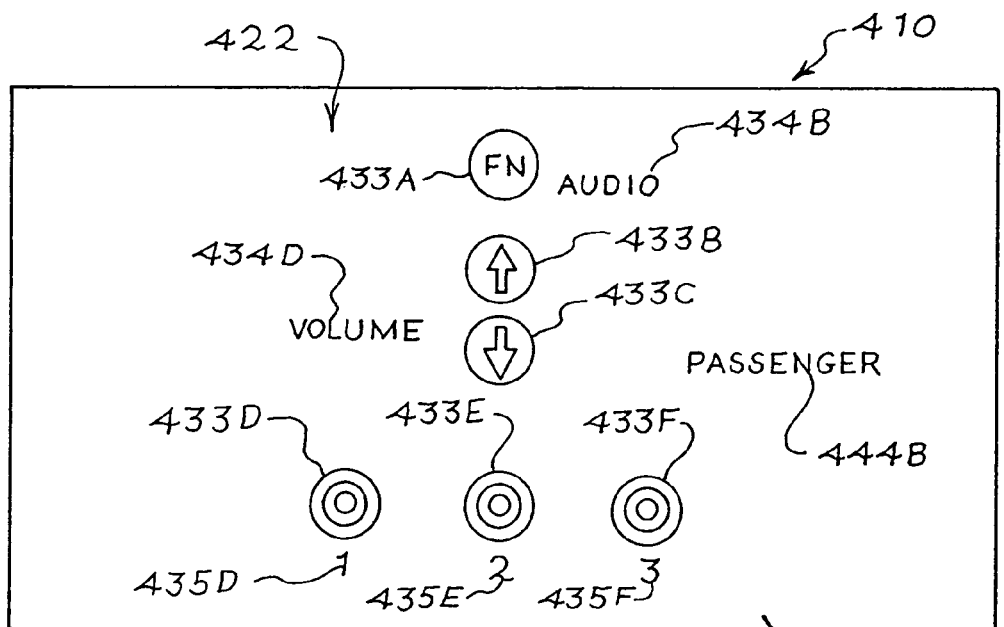

In FIG. 6D, the passenger has triggered operative sensor 430A, which changes the control panel from the climate control mode to the audio mode. Visible indicia 433A-F and 444B are still displayed on the front side of the trim component 410; however, indicia 434A, 434C, and 435A-C are no longer displayed and are replaced by indicia 434B, 434D, and 435D-F that indicate the function of each sensor and that the control panel is in the audio control mode. The passenger may now selectively trigger operative sensors 430B-C to increase or decrease the volume of the audio device and may selectively trigger sensors 430D-F, for example, to select a preset radio station.

Once an initial sensor 440A-B has been selected and the display device is activated, the controls will remain visible on the trim component until the display device is deactivated. A timer may be provided to deactivate the display device after a predetermined amount of time from a prior detection by any of the operative sensors 430A-F. When the display device is deactivated, the indicia disappear, leaving a clean and uncluttered trim component surface.

Throughout this specification various indications have been given as to preferred and alternative embodiments of the invention. However, it should be understood that the invention is not limited to any one of these. It is therefore intended that the foregoing detailed description be regarded as illustrative rather than limiting, and that it be understood that it is the appended claims, including all equivalents, that are intended to define the spirit and scope of this invention.

The invention claimed is:

1. A system for operating an output device in a vehicle, the system comprising:
   a trim component having a front side and a back side;
   an initial sensor positioned at the back side of the trim component and defining a first sensing region adjacent to the front side of the trim component, the first sensing region being hidden from view, the initial sensor configured to provide a signal to a display device to selectively display the location of a second sensing region on the front side of the trim component when an object is detected within the first sensing region, the initial sensing region being hidden when the second sensing region is being displayed; and
   an operative sensor positioned at the back side of the trim component and respectively defining the second sensing region adjacent the front side of the trim component, the second sensing region being hidden from view until caused to be displayed by the first sensor, the operative sensor configured to provide a signal to at least one output device when an object is detected within the second sensing region.

2. The system of claim 1 comprising at least one additional sensor positioned at the back side of the trim component.

3. The system of claim 2, wherein at least one of the additional sensors is an operative sensor for providing a signal to at least one output device when an object is detected within a respective sensing region adjacent the front side of the trim component.

4. The system of claim 2, wherein at least one of the additional sensors is an initial sensor for providing a signal to the display device when an object is detected within a respective sensing region adjacent the front side of the trim component.

5. The system of claim 1, further comprising a timer coupled to the display device and configured to deactivate the display device after a predetermined amount of time.

6. The system of claim 1, wherein the trim component is translucent.

7. The system of claim 1, wherein the trim component is at least partly opaque.

8. The system of claim 1, further comprising a display device configured to selectively display one or more indicia on the front side of the trim component.

9. The system of claim 8, wherein the display device comprises a lighting element for projecting one or more indicia on the front side of the trim component.

10. The system of claim 8, the trim component further comprising a front layer having a front surface and a back surface layer having a back surface, the front surface layer being more translucent than the back surface layer, wherein the back surface layer comprises an aperture that provides an optical pathway between the back surface and the front surface.

11. The system of claim 1, wherein at least one of the operative sensor and the initial sensor is a Hall-effect sensor.

12. The system of claim 1, wherein at least one of the operative sensor and the initial sensor is a capacitive sensor.

13. The system of claim 1, wherein the trim component is an automotive trim component.

14. The system of claim 1, wherein the initial sensor is configured to detect an object within a first maximum distance from the trim component and the operative sensor is configured to detect an object within a second maximum distance from the trim component that is less than the first maximum distance.

15. A method of operating an output device in a vehicle, the method comprising the steps of:
providing a trim component having a front side and a back side;
sensing an object within a first sensing region adjacent the front side of the trim component and hidden from view;
providing a signal to a display device for selectively displaying the location of a second sensing region adjacent the front side of the trim component, the second sensing region being hidden from view until caused to be displayed by the sensing step of the first sensing region, the first sensing region remaining hidden from view during displaying of the second sensing region; and
sensing an object within the second sensing region.

16. The method of claim 15, further comprising the step of providing a signal to at least one output device when an object is detected within the second sensing region.

17. The method of claim 15, further comprising the steps of:
sensing an object within a third sensing region adjacent the front side of the trim component; and
providing a signal to a display device for selectively displaying the location of a fourth sensing region adjacent the front side of the trim component, the third sensing region being hidden from view during displaying of the fourth sensing region.

18. The method of claim 15, further comprising the steps of:
providing a signal to at least one output device for performing a first function when an object is detected within the second sensing region;
sensing an object within a third sensing region adjacent the front side of the trim component; and
providing a signal to the at least one output device for performing a second function when an object is detected within the second sensing region.

19. The method of claim 15, further comprising the step of deactivating the display device after a predetermined amount of time.

20. The method of claim 15, further comprising the steps of:
sensing an object within the first sensing region at a first distance from the trim component; and
sensing the object within the second sensing region at a second distance from the trim component, wherein the second distance is less than the first distance.

* * * * *